United States Patent
Tseng

[19]

[11] Patent Number: 5,869,393
[45] Date of Patent: Feb. 9, 1999

[54] METHOD FOR FABRICATING MULTI-LEVEL INTERCONNECTION

[75] Inventor: Horng-Huei Tseng, Hsinchu, Taiwan

[73] Assignee: Vanguard International Semiconductor Corp., Hsinchu, Taiwan

[21] Appl. No.: 665,861

[22] Filed: Jun. 19, 1996

[51] Int. Cl.[6] ............................................. H01L 21/4763
[52] U.S. Cl. .......................................... 438/622; 438/639
[58] Field of Search ................................... 438/576, 618, 438/629, 637, 622, 623, 624, 639

[56] References Cited

U.S. PATENT DOCUMENTS

| | | |
|---|---|---|
| 4,656,732 | 4/1987 | Teng et al. . |
| 5,106,780 | 4/1992 | Higuchi . |
| 5,244,837 | 9/1993 | Dennison ............................. 438/622 |
| 5,330,934 | 7/1994 | Shibata et al. . |
| 5,543,360 | 8/1996 | Matsuoka et al. . |

*Primary Examiner*—Edward Wojciechowicz
*Assistant Examiner*—S. V. Clark
*Attorney, Agent, or Firm*—Christensen O'Connor Johnson & Kindness PLLC

[57] ABSTRACT

The present invention discloses a method of fabricating a multi-level interconnection on semiconductor substrate. A dielectric layer is formed on the substrate, and a first conductive layer is formed on the dielectric layer. An IMD layer is formed on the first conductive layer, a buffer layer is formed on the first IMD layer, a second conductive layer is formed on the buffer layer, and a second metal dielectric layer having a hole with a shallow trench is formed on the buffer layer. The width of the second conductive layer is the same with the width of the hole. A third conductive layer is formed, filling the shallow trench. The third conductive layer also contacts a sidewall of the hole and is accessible from the top of the second metal dielectric layer.

21 Claims, 3 Drawing Sheets

5,869,393

METHOD FOR FABRICATING MULTI-LEVEL INTERCONNECTION

FIELD OF THE INVENTION

The present invention relates to integrated circuits and, more specifically, an integrated circuit multi-level interconnection structure which provides a better step coverage.

BACKGROUND OF THE INVENTION

In order to build an integrated circuit, it is generally necessary to fabricate active devices on a single substrate. In addition, it is a long-standing goal in the integrated circuit industry to make the active devices as small as possible; i.e., scale the active devices. The aim of device scaling has been two-fold: (1) to increase circuit performance (increasing circuit speed); and (2) to decrease the size of the integrated circuits so as to allow an increase in the functional complexity of the circuit (i.e., make practical the fabrication of highly integrated, complex integrated circuits). Scaling down of active device sizes was a very effective means of achieving these goals. However, the scaling of active devices has become less effective, as the limitations of the circuit speed and maximum functional density come to depend more on the characteristics of the interconnects than on the scaled devices. Since current MOS and bipolar technology devices almost invariably require more than one level of interconnect, this dependency on the interconnects is more pronounced.

Before a circuit element formed in silicon or gallium arsenide can perform a useful function, it generally must be electrically connected with other elements on the same chip and most certainly must be connected with circuitry not on the same chip. An integrated circuit is by definition a number of electrically interconnected circuit elements on the same chip. Some of the interconnections are done in the silicon itself, but most are done by means of thin conductive stripes running across the top surface of the wafer.

Referring to FIG. 1, a conventional method of fabricating a via (i.e., an interconnection between a conductor in one layer with a conductor in another layer) is described. The conventional method begins with a silicon wafer, preferably with a single crystalline substrate 10. After devices are formed on the semiconductor substrate 10 in a conventional manner, a dielectric layer 12 is formed on the substrate 10. The dielectric layer 12 is composed of BPSG (borophosphosilicate glass). Next, a first conductive layer 14 is formed on the dielectric layer 12. The conductive layer 14 is typically formed by deposition of a metal such as aluminum. A first inter-metal dielectric (IMD) layer 16 is then formed over the first conductive layer 14. Typically, the first IMD layer 16 is formed by depositing an oxide.

Subsequently, a second conductive layer is formed on the first IMD layer 16. Then, standard photolithography and etching steps are performed to form a conductive line 18 (shown in cross-section) on the top surface of the first IMD layer 16. It is understood that other conductive lines or regions (not shown) are also formed in the second conductive layer. Typically, the width of the conductive lines formed in the second conductive layer are about 0.25 mm–0.7 mm.

Referring to FIG. 2, a photoresist 22 having an opening or hole is formed in a conventional manner on the second IMD layer 20. The width of the opening is the same as the conductive line 18 formed in the second conductive layer. Ideally, the hole is perfectly aligned with the conductive line 18; however, such alignment is difficult to achieve. Instead, the hole is commonly partially misaligned with the conductive line 18 as shown in FIG. 2. An anisotropic etching step is then performed to form a via hole through the second IMD layer 20 to the conductive line 18. However, because the via hole is partially misaligned with the conductive line 18, the via hole penetrates the first IMD layer 16 to the first conductive layer 14.

As shown in FIG. 3, the anisotropic etching step creates a via hole 24 with a deep trench 26 to the surface of the first conductive layer 14. Because of the added depth of the trench 26, the via hole 24 has a relatively large aspect ratio. Subsequently, the photoresist is removed and a third conductive layer 28 is deposited on the second IMD layer 20 to fill the via hole 24 and then patterned and etched to form the via. Typically, this conductive layer is a metal layer or metal stack. However, the high aspect ratio of the via hole 24 causes the third conductive layer 28 to have poor step coverage. Consequently, the metal is deposited on the side wall of the second IMD layer 20 and does not completely fill the via hole. As is well known in the art of integrated circuit fabrication, the reduced amount of metal contacting the conductive line 18 undesirably increases the resistance of the via. In the worst case, the third conductive layer 28 short circuits the first conductive layer 14 to the conductive line 18.

To overcome this problem, conventional via fabrication methods typically increase the width of the portion of the conductive line 18 where a via is to be formed to allow for misalignment of the via hole with the conductive line 18. Of course, this wider portion or border causes the conductive line 18 to undesirably occupy more area. This increased area usage can become significant in integrated circuits having a large number of vias. In addition, these wider portions cause the conductive lines in a layer to be spaced farther apart than would be necessary if the conducive lines had no wide portions for vias. Thus, the wider portions undesirably cause a limitation in the degree of scaling possible for a given process. More specifically, even if the active devices can be made smaller, the wider portions in the conductive lines needed to form vias prevent the active devices from being more closely together.

SUMMARY OF THE INVENTION

In accordance with the present invention, a method of fabricating borderless interconnect structure is provided. In one embodiment, the method includes forming a dielectric layer on a wafer with devices on or in the wafer. Then, a first conductive layer is formed above the dielectric layer, followed by a first IMD layer formed above the first conductive layer. Next, a buffer layer is formed above the first IMD layer, with a second conductive layer formed on the buffer layer. The second conductive layer is patterned to form interconnect lines on the top surface of the barrier layer. Then, a second IMD layer is formed over and on the buffer layer and the second conductive layer. A photoresist is patterned so as to form an etching mask with an opening on the second IMD layer that is substantially aligned with the conductive line in the second conductive layer. The width of the opening is the substantially the same as the width of the line in the second conductive layer. Then a via hole is formed in the second IMD layer to the conductive line using an anisotropic etching process. If the opening in the photoresist is misaligned with the conductive line, the via hole will include a shallow trench in the buffer layer. The shallow trench adjoins the sidewall of the conductive line, but is substantially less deep than the trench formed in the aforementioned conventional borderless process because the buffer layer has a much slower etch rate than the second IMD layer. The photoresist is then stripped and a third conductive layer is formed so as to fill the via hole. Because the trench in the via hole is shallow, the aspect ratio of the via hole is relatively small, thereby allowing improved step coverage. As a result, the via hole is more completely filled compared to conventional borderless process. Accordingly, a via formed according to the present invention has lower resistance than the conventional borderless process. Moreover, the buffer layer helps prevent short circuit the conductive line to the first conductive layer, which can occur in the conventional borderless process. Because a low resistance borderless via is formed, the conductive lines formed in the conductive layers may be laid out more closely together, thereby allowing the integrated circuit to be more highly integrated.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION

Figure 1:
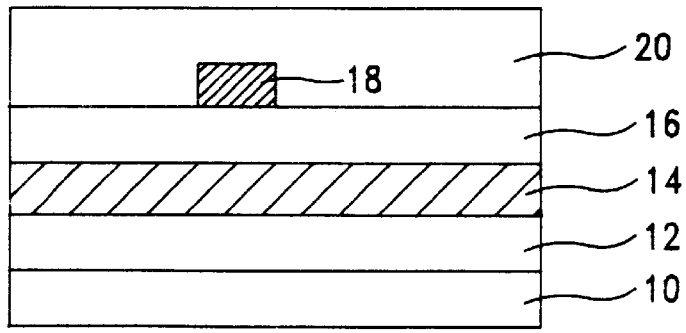
FIG. 1 is a cross section view of a semiconductor wafer illustrating the steps of forming a dielectric layer, a first conductive layer, a first IMD layer, a second conductive layer and second IMD layer in a conventional via fabrication process.
Figure 2:
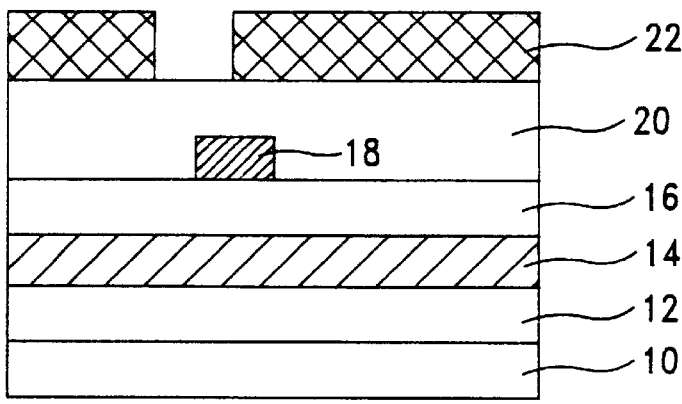
FIG. 2 is a cross section view of a semiconductor wafer illustrating the steps of forming a patterned photoresist on the second IMD layer in a conventional via fabrication process.
Figure 3:
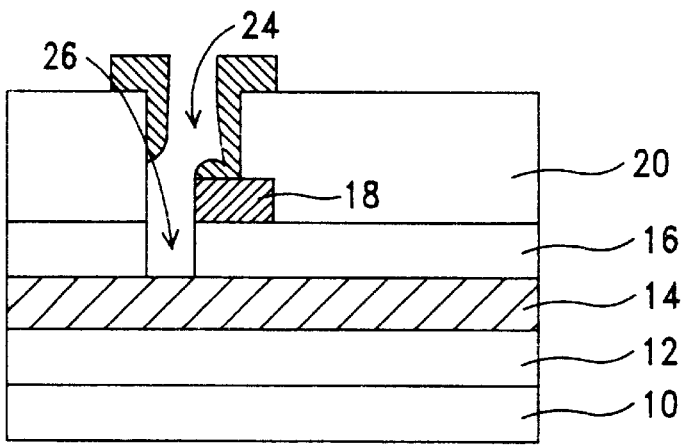
FIG. 3 is a cross section view of a semiconductor wafer illustrating the steps of forming a hole and forming a third conductive layer on the second IMD layer in a conventional via fabrication process.
Figure 4:
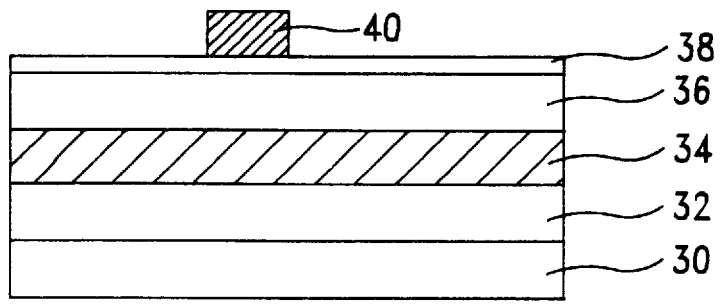
FIG. 4 is a cross section view of a semiconductor wafer illustrating the steps of forming an dielectric layer, a first conductive layer, a first IMD layer, a buffer layer and second conductive layer in accordance with one embodiment of the invention.

FIG. 4 illustrates the initial steps of a method of fabricating an inter-layer interconnection according to one embodiment of the present invention. A single crystal silicon wafer is used, which preferably has a <100> crystallographic orientation. After devices are formed on the semiconductor substrate 30 in any suitable manner, a dielectric layer 32 is then formed on the substrate 30 having a thickness of about 6000 angstrom, although any thickness is the range 4000–10000 angstromsmay be used. Any suitable material can be used to form the dielectric layer 32 such as, for example, borophosphosilicate glass (BPSG ). Next, a first conductive layer 34 having a thickness of about 4000–8000 angstroms, is formed on the dielectric layer 32 using any suitable conventional process. The first conductive layer 34 can be any suitable conductive material such as, for example, a metal (e.g., aluminum), a metal stack, doped polysilicon or in-situ doped polysilicon.

A first inter-metal dielectric (IMD) layer 36 is then formed over the first conductive layer 34 using convention methods. The first IMD layer 36 can be formed from any suitable dielectric material. In one embodiment, the first IMD layer 36 is composed of silicon dioxide and has a thickness of about 6000 angstroms. Other embodiments form the first IMD layer 36 by depositing silicon dioxide using a chemical vapor deposition (CVD) process such as low pressure CVD (LPCVD). Next, a buffer layer 38 is formed on the first IMD layer 36. The buffer layer 38 can be composed of any suitable dielectric material having a relatively slow etch rate compare compared to silicon dioxide (future second IMD). For example, in one embodiment, the buffer layer 38 is composed of amorphous silicon, with the layer having a thickness of about 300–800 angstroms. In another embodiment, the buffer layer 38 is composed of nitride layer having a thickness of about 500–1500 angstroms. The buffer layer 38 must be thick enough so that the buffer layer 38 is not completely etched away in a subsequent etching step (described below in conjunction with FIG. 6.

Next, a second conductive layer having a thickness of about 4000–8000 angstroms is formed on the buffer layer 38. Similarly, the second conductive layer can be formed from any suitable conductive material such as a metal, a metal stack, doped polysilicon or in-situ doped polysilicon. Then the second conductive layer is patterned using conventional photolithography and etching steps to form a conductive line 40. The width of the conductive line 40 is about 0.25–0.7 micron meter. The resulting structure is shown in FIG. 4.

Figure 5:
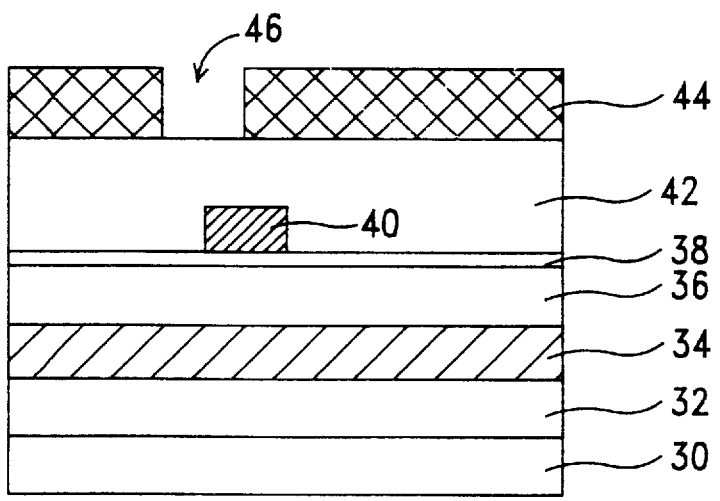
FIG. 5 is a cross section view of a semiconductor wafer illustrating the steps of forming a second IMD layer and a patterned photoresist in accordance with one embodiment of the invention.

Referring to FIG. 5, a second IMD layer 42 is formed over the buffer layer 38 and the conductive liner 40. Similarly, the second IMD layer 42 is composed of silicon dioxide having a thickness of about 5000–8000 angstroms. Alternatively, the second IMD layer can be a silicon oxide deposited by LPCVD. Preferably, both the first IMD layer 36 and the second IMD layer 42 are substantially planar.

Subsequently, a photoresist 44 is formed on the second IMD layer 42 and then patterned using standard photolithographic and etching techniques to have an opening 46 substantially aligned with the conductive line 40. Ideally, the opening 46 is perfectly aligned with the conductive line 40. However, in practice, the opening 46 is often partially misaligned with the conductive line 40 because of the photoresist shifting or distortions in the photolithography. The width of the opening 22 is substantially the same as the width of conductive line 40.

Figure 6:
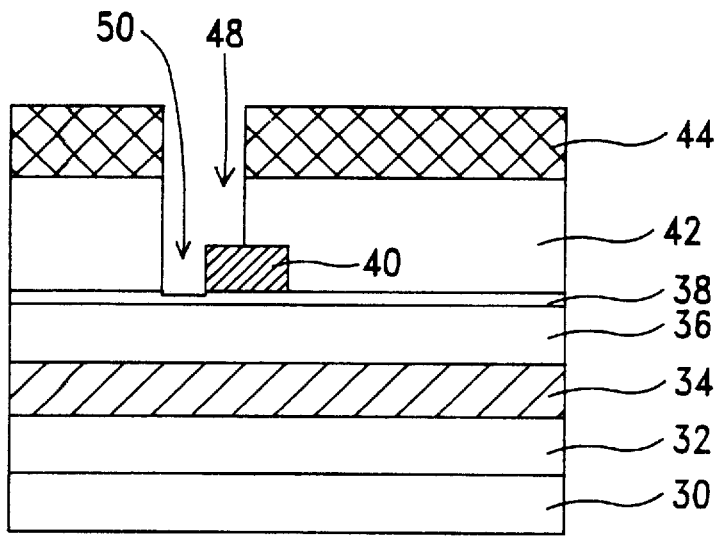
FIG. 6 is a cross section view of a semiconductor wafer illustrating the steps of forming a hole through the second IMD layer in accordance with one embodiment of the invention.

As shown in FIG. 6, an anisotropic etching process is then performed to create a hole 48 exposing a portion of the conductive line 40. The hole 48 includes a shallow trench 50 in the buffer layer 38 exposing a sidewall of the conductive line 40. The trench 50 is shallow because of the low etch rate of the buffer layer. Consequently, the aspect ratio of the hole 48 is relatively small. Of course, if the opening 46 is perfectly aligned with the conductive line 40, then the entire upper surface of the conductive line 40 would be exposed and the trench 50 would not be formed. The etchant used in the etching process can be any suitable etchant having a high selectivity for the IMD material and a low selectivity for the buffer layer material. For example, the etchant is $CF_4$ and $CHF_3$ in one embodiment.

Figure 7:
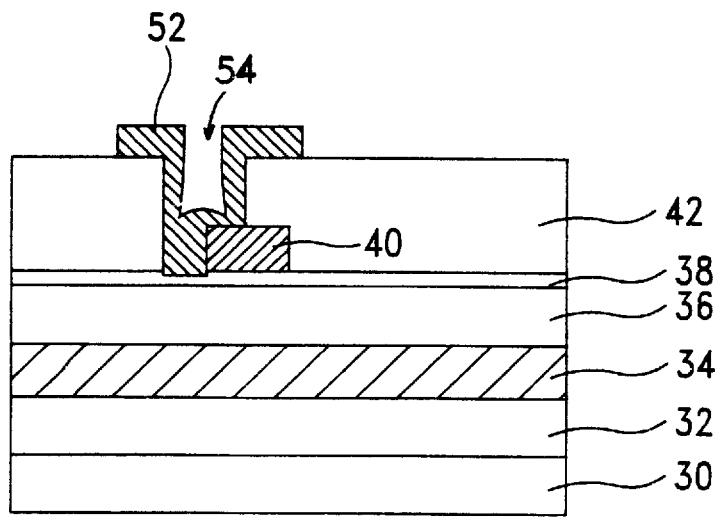
FIG. 7 is a cross section view of a semiconductor wafer illustrating the steps of forming a third conductive layer in accordance with one embodiment of the invention.

As shown in FIG. 7, the photoresist is then stripped in a conventional manner. Then a third conductive layer having a nominal thickness of about 4000–8000 angstroms is formed on the second IMD layer 42, thereby forming a inter-layer interconnection. The third conductive layer is formed from any suitable conductive material such as, for example, a metal, a metal stack, doped polysilicon or in-situ doped polysilicon. The third conductive layer may be formed in any suitable manner such as, for example, sputtering or CVD, as appropriate for the conductive material. In the preferred embodiment, the third conductive layer is composed of aluminum deposited by sputtering [?]. The aluminum is deposited on the side wall of the hole 48 and, in addition, substantially fills the shallow trench 50. Because of the low aspect ratio of the hole 48, the step coverage of the third conductive layer is better than the aforementioned conventional method. The third conductive layer is then patterned and etched in a conventional manner to form an inter-layer interconnection 52 shown in FIG. 7. If desired, the cavity 54 in the inter-layer interconnection 52 may be filled with aluminum or some other conductor in a conventional manner.

Because of the better step coverage, the inter-layer interconnection 52 has a lower resistance than the conventional borderless process. Moreover, the buffer layer helps prevent a short circuit between the conductive line 40 and the first conductive layer 34, which can occur in the conventional borderless process. Further, because the inter-layer interconnection 52 is borderless, the conductive lines formed in the second conductive layer may be laid out more closely together, thereby allowing the integrated circuit to be more highly integrated than conventional methods using borders.

The embodiments described above are intended to be illustrative rather than limiting the invention to the described embodiments. For example, although the inter-layer interconnection described is similar to a via, in other embodiment, a contact is formed. Accordingly, while the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method of fabricating an inter-layer interconnection on a semiconductor substrate, said method comprising:

forming a first dielectric layer on said semiconductor substrate;

forming a first conductive layer on said first dielectric layer;

forming a second dielectric layer on said first conductive layer;

forming a buffer layer on said second dielectric layer;

forming a second conductive layer on said buffer layer;

patterning said second conductive layer;

forming a third dielectric layer on said second conductive layer and on said buffer layer;

patterning a photoresist on said third dielectric layer;

etching said third dielectric layer to form a hole exposing at least a portion of said second conductive layer; and forming a third conductive layer on said third dielectric layer, on said second conductive layer and on the side wall of said hole, wherein said buffer layer has a slower etch rate than said third dielectric layer during said etching of said third dielectric layer.

2. The method of claim 1, wherein said dielectric layer comprises BPSG (borophosphosilicate glass).

3. The method of claim 1, wherein said first conductive layer, said second conductive layer said third conductive layer each comprise a metal layer.

4. The method of claim 3, wherein said metal layer is aluminum layer.

5. The method of claim 1, wherein said first conductive layer and said second conductive layer comprise doped polysilicon.

6. The method of claim 1, wherein said first conductive layer and said second conductive layer comprise in-situ doped polysilicon.

7. The method of claim 1, wherein said second dielectric layer comprises silicon dioxide.

8. The method of claim 1, wherein said third dielectric layer comprises silicon dioxide.

9. The method of claim 1, wherein said buffer layer comprises an amorphous silicon layer.

10. The method of claim 1, wherein said buffer layer comprises a nitride layer.

11. The method of claim 1, wherein said etching said third dielectric layer comprises using an etchant comprising $CF_4$ and $CHF_3$.

12. The method of claim 1, wherein said etching of said third layer forms a trench at the bottom surface of said hole, said trench exposing a sidewall of said second conductive layer and extending partially into said buffer layer.

13. The method of claim 12, wherein said trench is filled with said third conductive layer.

14. A method of forming an inter-layer interconnection in a multi-layer integrated circuit, said method comprising:

forming a first dielectric layer;

forming a buffer layer above said first dielectric layer;

forming a first conductive region above said buffer layer, said first conductive region having a width;

forming a second dielectric layer over said first conductive region and said buffer layer;

anisotropically etching a hole, whereby a portion of said first conductive region is exposed, said hole not extending into said first dielectric layer; and forming said inter-layer interconnection of a conductive material said inter-layer interconnection extending to said hole so as to make electrical contact with said first conductive region and extending out of said hole so as to be accessible from a top surface of said second dielectric layer.

15. The method of claim 14 wherein said hole includes a trench exposing a sidewall of said first conductive region.

16. The method of claim 15 wherein said trench partially extends into said buffer layer.

17. The method of claim 14 wherein said forming of said buffer layer comprises depositing a nitride layer on said dielectric layer.

18. The method of claim 14 wherein said forming of said buffer layer comprises depositing an amorphous silicon layer on said dielectric layer.

19. The method of claim 14 wherein said forming of said second dielectric layer comprises depositing an oxide layer on said buffer layer.

20. The method of claim 14 wherein said forming of said inter-layer interconnection comprises depositing a metal layer on said second dielectric layer.

21. The method of claim 14 wherein said forming of said inter-layer interconnection comprises depositing a polysilicon layer on said second dielectric layer.

* * * * *